United States Patent
Masahara et al.

(10) Patent No.: US 7,189,669 B2
(45) Date of Patent: Mar. 13, 2007

(54) DIELECTRIC CERAMIC MATERIAL AND MULTILAYER CERAMIC SUBSTRATE

(75) Inventors: Koh Masahara, Osaka (JP); Hiroshi Nonoue, Hirakata (JP); Kenichiro Wakisaka, Iga (JP)

(73) Assignee: Sanyo Electric Co., Ltd., Osaka (JP)

( * ) Notice: Subject to any disclaimer, the term of this patent is extended or adjusted under 35 U.S.C. 154(b) by 89 days.

(21) Appl. No.: 11/057,218

(22) Filed: Feb. 15, 2005

(65) Prior Publication Data

US 2005/0215411 A1 Sep. 29, 2005

(30) Foreign Application Priority Data

Mar. 26, 2004 (JP) .............................. 2004-093425

(51) Int. Cl.
C03C 10/02 (2006.01)
C03C 14/00 (2006.01)

(52) U.S. Cl. .......................................... 501/10; 501/32

(58) Field of Classification Search .................. 501/10, 501/32
See application file for complete search history.

(56) References Cited

U.S. PATENT DOCUMENTS 6,753,070 B2 * 6/2004 Mori et al. .................. 428/209
6,946,415 B2 * 9/2005 Chikagawa et al. .......... 501/32

FOREIGN PATENT DOCUMENTS

| JP | 8-188446 | * | 7/1996 |
| JP | 10-120436 | | 5/1998 |
| JP | 11-012029 | | 1/1999 |

* cited by examiner

*Primary Examiner*—Karl Group
(74) *Attorney, Agent, or Firm*—McDermott Will & Emery LLP

(57) ABSTRACT

A dielectric ceramic material which is obtained by firing a raw material comprising an alumina powder and a glass powder containing at least $SiO_2$ and $MgO$, the dielectric ceramic material being characterized in that a ratio ($MgAl_2O_4$ (311)/$Al_2O_3$ (116)) in X-ray diffraction peak intensity of an $MgAl_2O_4$ (311) to an $Al_2O_3$ (116) is at least 0.5.

2 Claims, 3 Drawing Sheets

DIELECTRIC CERAMIC MATERIAL AND MULTILAYER CERAMIC SUBSTRATE

The priority Japanese Patent Application Number 2004-932425 upon which this patent application is based is hereby incorporated by reference.

BACKGROUND OF THE INVENTION

1. Field of the Invention

The present invention relates to a dielectric ceramic material which can be obtained through low-temperature firing and also to a multilayer ceramic substrate using the dielectric ceramic material.

2. Description of Related Art

With the need of miniaturizing recently spread mobile communication equipment, such as portable phones, and portable communication terminals, the size reduction and performance increase of high-frequency circuit parts for use therein have been pursued.

In high-frequency circuit substrates, a conventional module including a printed substrate and a capacitor or inductor mounted on its surface has been increasingly replaced by a smaller size module consisting of multilayers of dielectric ceramic substrates each patterned with a capacitor or an inductor circuit.

The multilayer ceramic substrate is generally fabricated by providing multilayers of green sheets, such as glass ceramics, each carrying a predetermined circuit pattern formed by screen printing or the like, and firing them at a temperature of about 900° C.–about 1,000° C. A popular material used for the circuit pattern is high-conductivity and air-firable silver (Ag).

Where silver is used as a material for circuit pattern, a dielectric ceramic material for use in the multilayer ceramic substrate needs to be fired at a low temperature of about 900° C.–about 1,000° C., as described above, and generally comprises a low-firable glass ceramic material obtained by mixing a ceramic filler, e.g. alumina, and a glass (See, for example, Japanese Patent No. 3441924 and Japanese Patent Laying-Open No. Hei 10-120436). However, the higher glass loading lowers mechanical strength, which has been a problem.

SUMMARY OF THE INVENTION

It is an object of the present invention to provide a dielectric ceramic material which can be obtained through low-temperature firing and has high mechanical strength, as well as providing a multilayer ceramic substrate using the dielectric ceramic material.

The dielectric ceramic material of the present invention is obtained by firing a raw material comprising an alumina powder and a glass powder containing at least $SiO_2$ and MgO. Characteristically, a ratio ($MgAl_2O_4$ (311)/$Al_2O_3$ (116)) in X-ray diffraction peak intensity of an $MgAl_2O_4$ (311) to an $Al_2O_3$ (116) is at least 0.5.

The inventors of this application have come to complete this invention through their finding that a high-mechanical strength dielectric ceramic material is obtained by firing a raw material comprising an alumina powder and a glass powder containing at least $SiO_2$ and MgO such that a ratio ($MgAl_2O_4$ (311)/$Al_2O_3$ (116)) in X-ray diffraction peak intensity of an $MgAl_2O_4$ (311) to an $Al_2O_3$ (116) is brought to at least 0.5. In accordance with the present invention, a dielectric ceramic material is provided which can be obtained through firing at a low temperature of about 900° C.–about 1,000° C. and yet exhibits high mechanical strength.

In the present invention, the $MgAl_2O_4$ crystals are generally formed by firing. A preferred method for formation of the $MgAl_2O_4$ crystals preferably involve maintaining the raw material at a temperature near a softening point of the glass powder for a certain period of time during the firing process. Specifically, the raw material is preferably maintained for 0.5 hours–10 hours, more preferably 1 hour–5 hours. Also preferably, a maximum temperature during the firing process is set at a level above a crystallization initiating temperature of the glass powder.

Formation of the $MgAl_2O_4$ crystals are rendered easier when a ratio of the alumina powder to the glass powder is kept within a suitable range.

The glass powder for use in the present invention suffices if it contains at least $SiO_2$ and MgO. The glass powder for use in the present invention preferably comprises a crystallizable glass and more preferably comprises a crystallizable glass containing $SiO_2$, MgO and CaO. The crystallizable glass, as used herein, refers to a glass which crystallizes when it is fired. Such a glass may have a composition comprising 40–70% by weight of $SiO_2$, 20–40% by weight of CaO, 10–30% by weight of MgO and 10–20% by weight of ZnO, for example.

In the present invention, the glass powder and the alumina powder may be blended in any ratio. It is however preferred that they are blended in the ratio of 30:70–60:40.

The multilayer ceramic substrate of the present invention is obtained by firing multilayers of ceramic green sheets each comprising a dielectric layer and an electrode layer formed on the dielectric layer. Characteristically, the dielectric layer after the firing comprises the dielectric ceramic material of the present invention.

Since its dielectric layers comprise the dielectric ceramic material of the present invention, the multilayer ceramic substrate of the present invention can be obtained through low-temperature firing and has high mechanical strength.

In accordance with the present invention, a dielectric ceramic material and a multilayer ceramic substrate are provided which can both be obtained through firing at a low temperature of about 900° C.–about 1,000° C. and have high mechanical strength.

DESCRIPTION OF THE PREFERRED EXAMPLES

The present invention is now described in detail with reference to examples. The following examples illustrate the practice of the present invention but are not intended to be limiting thereof.

(Preparation of Dielectric Ceramic Material)

450 g of α-alumina powder (mean particle diameter 3 μm), 550 g of a crystallizable glass (50 wt. % $SiO_2$, 20 wt. % CaO, 20 wt. % MgO, 10 wt. % ZnO, mean particle diameter 3 μm, softening point 750° C., crystallization initiating temperature 800° C., 450 g of isopropanol (IPA), 300 g of butyl acetate, 20 g of an olefin-maleic acid copolymer dispersant, 120 g of a polyvinyl acetate binder and 50 g of an acrylic binder were pulverized and mixed in a ball mill for 4 hours.

The resulting slurry was formed into a 50 μm thick sheet using a doctor blade equipment. 50 mm square layers were cut out from this sheet. 20 of such layers were stacked in a pile and press bonded to provide a sheet. Then, 20 mm long and 5 mm wide test pieces were cut out from the press bonded sheet.

Figure 1:
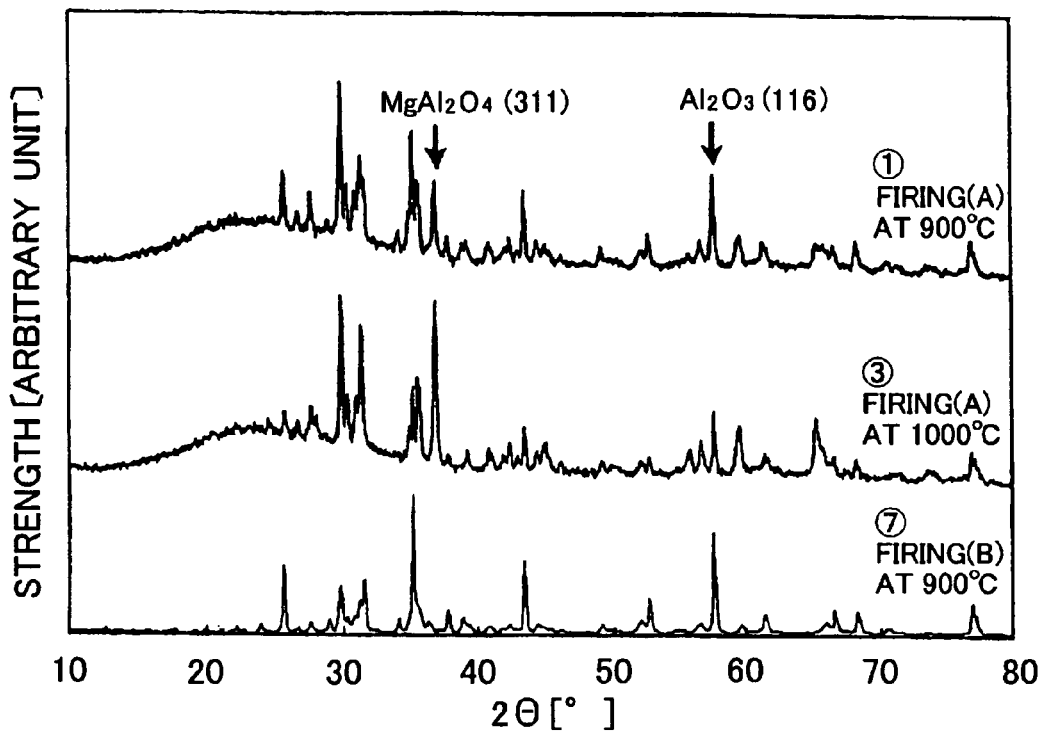
FIG. 1 is a graph showing an XRD profile for dielectric ceramic materials prepared in Example in accordance with the present invention.
Figure 2:
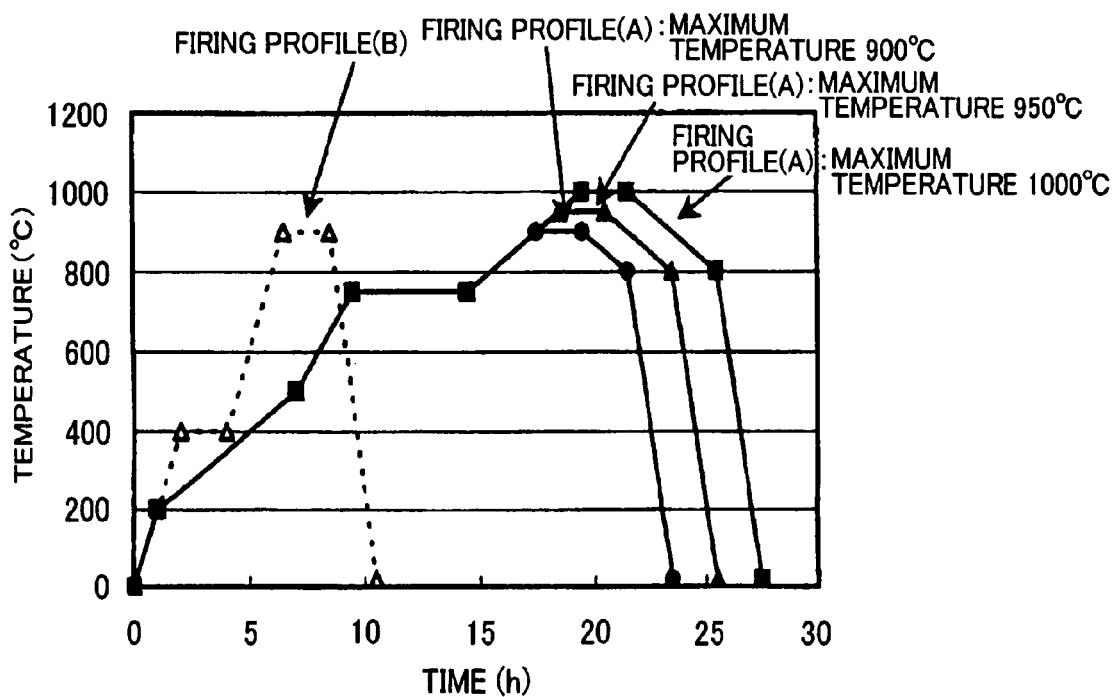
FIG. 2 is a graph showing firing profiles used in Example in accordance with the present invention.

The obtained test pieces were fired using the four different profiles shown in FIGS. 1 and 2; the profile (A) with a maximum temperature of 900° C., the profile (A) with a maximum temperature of 950° C., the profile (A) with a maximum temperature of 1,000° C., and the profile (B).

Also, the above procedure was followed, except that the α-alumina powder and crystallizable glass were each used in the amount of 500 g, to prepare a slurry. Using this slurry, test pieces were fabricated and fired in the same manner as above.

TABLE 1

| Firing Profile (A) Maximum Temperature 900° C. | | Firing Profile (A) Maximum Temperature 950° C. | | Firing Profile (A) Maximum Temperature 1000° C. | | Firing Profile (B) | |
|---|---|---|---|---|---|---|---|
| Time (h) | Temperature (° C.) | Time (h) | Temperature (° C.) | Time (h) | Temperature (° C.) | Time (h) | Temperature (° C.) |
| 0 | 0 | 0 | 0 | 0 | 0 | 0 | 0 |
| 1 | 200 | 1 | 200 | 1 | 200 | 2 | 400 |
| 7 | 500 | 7 | 500 | 7 | 500 | 4 | 400 |
| 9.5 | 750 | 9.5 | 750 | 9.5 | 750 | 6.5 | 900 |
| 14.5 | 750 | 14.5 | 750 | 14.5 | 750 | 8.5 | 900 |
| 17.5 | 900 | 18.5 | 950 | 19.5 | 1000 | 10.5 | 20 |
| 19.5 | 900 | 20.5 | 950 | 21.5 | 1000 | | |
| 21.5 | 800 | 23.5 | 800 | 25.5 | 800 | | |
| 23.5 | 20 | 25.5 | 20 | 27.5 | 20 | | |

As can be clearly seen from Table 1 and FIG. 2, when the firing profile (A) is used, the test pieces were maintained at a softening point of the crystallizable glass, i.e., at 750° C. for a duration of 5 hours.

(Measurement of Bending Strength)

The bending strength (three-point bending strength) for each of the obtained samples was measured. The measurement results are shown in Table 2.

TABLE 2

| Sample No. | Firing Profile | Maximum Temperature (° C.) | Glass:Alumina Weight Ratio | X-Ray Diffraction Peak Intensity Ratio $MgAl_2O_4$ (311)/ $Al_2O_3$ (116) | Bending Strength (MPa) |
|---|---|---|---|---|---|
| ① | A | 900 | 55:45 | 0.77 | 274 |
| ② | A | 950 | 55:45 | 1.50 | 254 |
| ③ | A | 1000 | 55:45 | 2.42 | 398 |
| ④ | A | 900 | 50:50 | 0.49 | 188 |
| ⑤ | A | 950 | 50:50 | 0.63 | 203 |
| ⑥ | A | 1000 | 50:50 | 0.98 | 249 |
| ⑦ | B | 900 | 50:50 | 0.00 | 130 |

(X-ray Diffraction (XRD) Measurement)

An XRD profile was measured for the sample Nos. 1–7 specified in Table 2. FIG. 1 shows a graph for XRD profiles of the sample Nos. 1, 3 and 7. As apparent from FIG. 1, a peak for the $MgAl_2O_4$ (311) was observed for the sample Nos. 1 and 3. On the other hand, the peak for the $MgAl_2O_4$ (311) was not observed for the sample No. 7.

A ratio ($MgAl_2O_4$ (311)/$Al_2O_3$ (116)) in peak intensity of the $MgAl_2O_4$ (311) to the $Al_2O_3$ (116) was determined and shown in Table 2. A bending strength in relation to this X-ray diffraction peak intensity ratio is also shown in FIG. 3.

Figure 3:
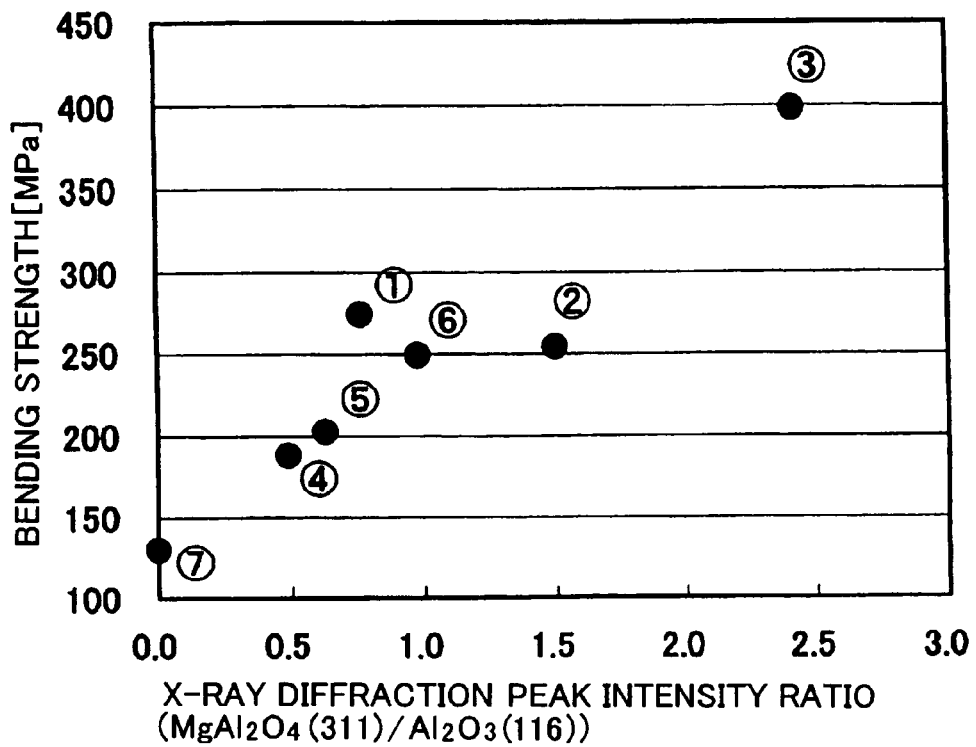
FIG. 3 shows a bending strength in relation to an X-ray diffraction peak intensity ratio ($MgAl_2O_4$ (311)/$Al_2O_3$ (116))

As can be clearly seen from Table 2 and FIG. 3, the sample Nos. 1–6 each including the $MgAl_2O_4$ crystal phase, which is a spinel-type crystal phase, exhibit higher bending strength compared to the sample No. 7 excluding this crystal phase. As can also be clearly seen from FIG. 3, the higher bending strength is obtained as the X-ray diffraction peak intensity ratio increases. Particularly when the X-ray diffraction peak intensity ratio is at least 0.5, a high bending strength of about 200 MPa or above is obtained.

(Multilayer Ceramic Substrate)

Figure 4:
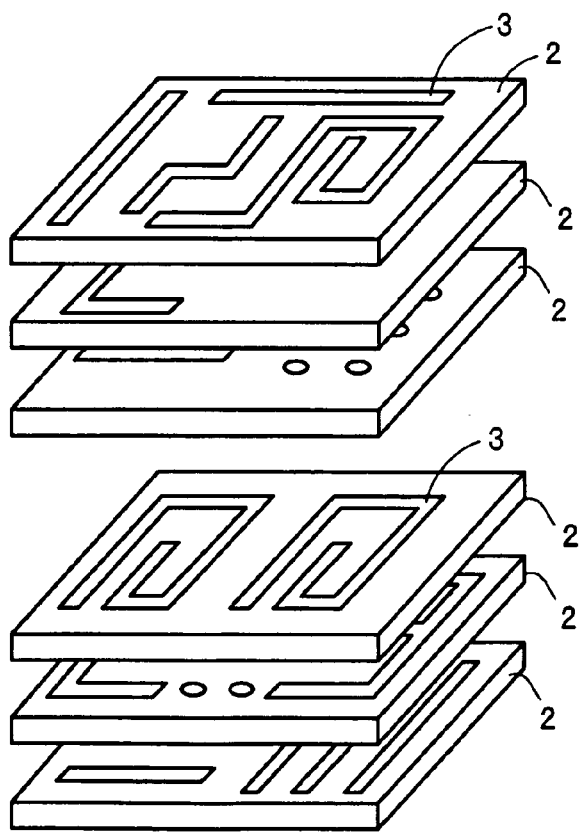
FIG. 4 is an exploded perspective view showing an embodiment of a multilayer ceramic substrate in accordance with the present invention.
Figure 5:
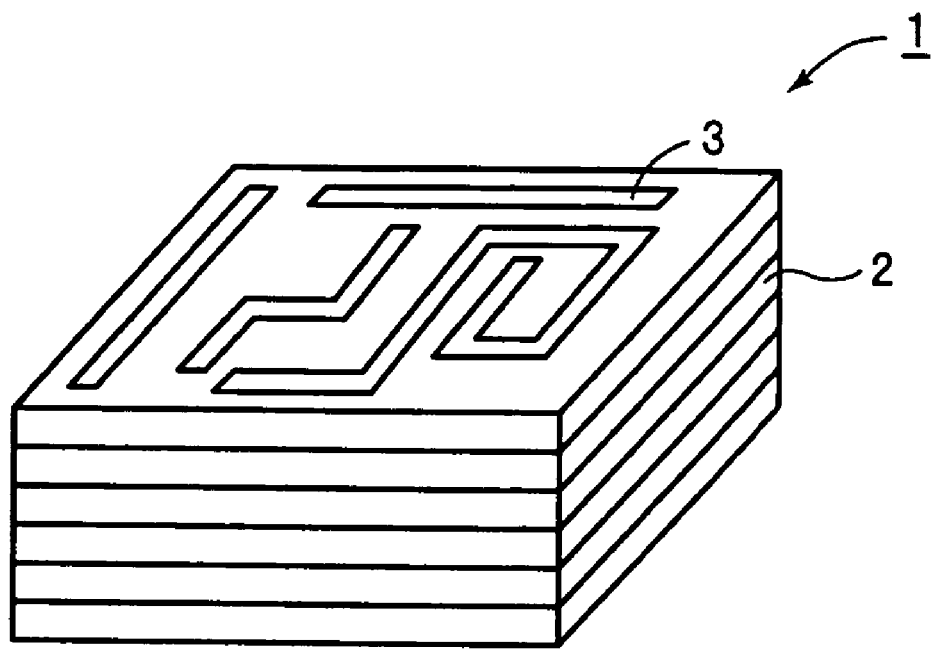
FIG. 5 is a perspective view showing an embodiment of a multilayer ceramic substrate in accordance with the present invention.

FIGS. 4 and 5 are an exploded perspective view and a perspective view, respectively, which show an embodiment of a multilayer ceramic substrate of the present invention. As shown in FIG. 4, an electrode layer 3, composed of silver, is formed on a dielectric layer 2. Superposing and subsequent firing of such dielectric layers 2 results in obtaining a multilayer ceramic substrate 1 as shown in FIG. 5. An inductor or capacitor, according to a circuit pattern of the electrode layer 3, is provided internally of the multilayer ceramic substrate 1.

The use of the dielectric ceramic material of the present invention for the dielectric layer 2 enables fabrication of a multilayer ceramic substrate which can be obtained through low-temperature firing and has a high bending strength.

What is claimed is:

1. A dielectric ceramic material which is obtained by firing a raw material comprising an alumina powder and a glass powder containing 40–70% by weight of $SiO_2$ and 10–30% by weight of MgO, the glass powder and the alumina powder being blended in the ratio of 30:70–60:40, said dielectric ceramic material being characterized that a ratio in X-ray diffraction peak intensity of an $MgAl_2O_4$ (311) to an $Al_2O_3$ (116) is at least 0.5.

2. A multilayer ceramic substrate which is obtained by firing multilayers of ceramic green sheets each having a dielectric layer composed of a raw material comprising the alumina powder and glass powder and an electrode layer formed on the dielectric layer, said multilayer ceramic substrate being characterized that said dielectric layer after the firing comprises the dielectric ceramic material as recited in claim 1.

* * * * *